United States Patent
Biela et al.

(10) Patent No.: US 8,760,214 B2
(45) Date of Patent: Jun. 24, 2014

(54) JFET SERIES CONNECTION

(75) Inventors: Jürgen Biela, Zürich (CH); Johann W. Kolar, Zürich (CH); Daniel Aggeler, Zürich (CH)

(73) Assignee: ETH Zurich, Zurich (CH)

( * ) Notice: Subject to any disclaimer, the term of this patent is extended or adjusted under 35 U.S.C. 154(b) by 203 days.

(21) Appl. No.: 13/144,085

(22) PCT Filed: Feb. 3, 2010

(86) PCT No.: PCT/CH2010/000028
§ 371 (c)(1),
(2), (4) Date: Aug. 4, 2011

(87) PCT Pub. No.: WO2010/088783
PCT Pub. Date: Aug. 12, 2010

(65) Prior Publication Data
US 2011/0291738 A1    Dec. 1, 2011

(30) Foreign Application Priority Data
Feb. 5, 2009 (CH) .......................... 160/09

(51) Int. Cl.
*H03K 17/687* (2006.01)
(52) U.S. Cl.
USPC ....................................... 327/430
(58) Field of Classification Search
USPC .............................. 327/427, 430
See application file for complete search history.

(56) References Cited

U.S. PATENT DOCUMENTS 6,822,842 B2 * 11/2004 Friedrichs et al. ............ 361/111
7,148,736 B1 * 12/2006 Tihanyi et al. ................ 327/377

FOREIGN PATENT DOCUMENTS

DE    19926109 A1    12/2000
JP    2000-59154 A    2/2000
(Continued)

OTHER PUBLICATIONS

Biela, J.; Aggeler, D.; Bortis, D.; Kolar, J.W., "5kV/200ns Pulsed Power Switch based on a SiC-JFET Super Cascode," IEEE International Power Modulators and High Voltage Conference, Proceedings of the 2008, vol., No., pp. 358,361, May 27-31, 2008.*

(Continued)

*Primary Examiner* — Patrick O'Neill
(74) *Attorney, Agent, or Firm* — Oppedahl Patent Law Firm LLC

(57) ABSTRACT

The invention relates to a switching device for switching a current between a first connection (1) and a second connection (2), comprising a series connection of at least two JFETs ($J_1$-$J_6$), of which a lowest JFET ($J_1$) is connected to the first connection (1), or the lowest JFET ($J_1$) is connected in a cascade circuit to the first connection (1) via a control switch (M), and at least one further JFET ($J_2$-$J_5$), which is connected in series to the lowest JFET ($J_1$), wherein the JFET ($J_6$) farthest away from the lowest JFET ($J_1$) is referred to as the uppermost JFET ($J_6$) and is connected with the drain connection to the second connection (2), and wherein a stabilization circuit ($D_{11}$-$D_{53}$) is connected between the gate connections of the JFETs ($J_1$-$J_6$) and the first connection (1) in order to stabilize the gate voltages of the JFETs ($J_1$-$J_6$). An additional circuit (4), which draws the potential at the gate connection ($G_6$) of the uppermost JFET ($J_6$) to the potential at the drain connection ($D_6$) of the uppermost JFET ($J_6$), is switched between the gate connection ($G_6$) of the uppermost JFET ($J_6$) and the second connection (2).

16 Claims, 3 Drawing Sheets

(56) References Cited

FOREIGN PATENT DOCUMENTS

| JP | 2003-289660 A | 10/2003 |
|---|---|---|
| JP | 2007-281196 A | 10/2007 |
| JP | 2008-79035 A | 4/2008 |

OTHER PUBLICATIONS

Biela, J.; Aggeler, D.; Bortis, D.; Kolar, J.W., "Balancing circuit for a 5kV/50ns pulsed power switch based on SiC-JFET Super Cascode," Pulsed Power Conference, 2009. PPC '09. IEEE , vol., No., pp. 635,640, Jun. 28, 2009-Jul. 2, 2009.*

Aggeler D et al: "A compact, high voltage 25 kW, 50 kHz DC-DC converter based on SiC JFETs" Applied Power Electronics Conference and Exposition, 2008. APEC 2008. Twenty-Third Annual IEEE, IEEE, Piscataway, NJ, USA, Feb. 24, 2008, pp. 801-807, XP03125339, ISBN:978-1-4244-1873-2.

International Search Report for PCT Application No. PCT/CH2010/000028, Mailed Jul. 15, 2010.

* cited by examiner

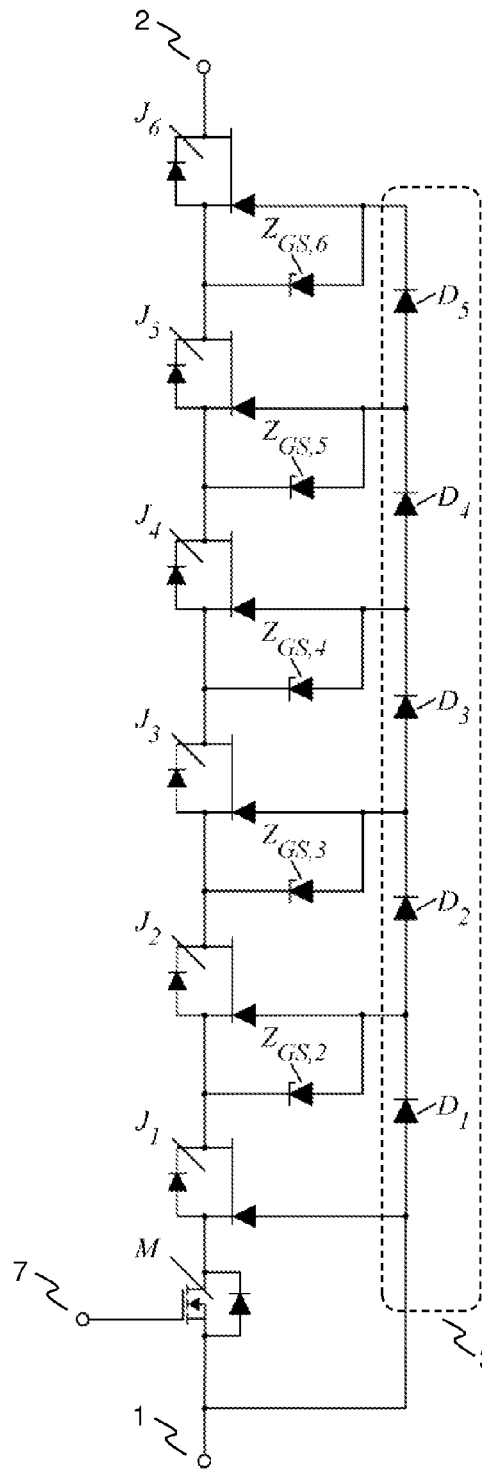
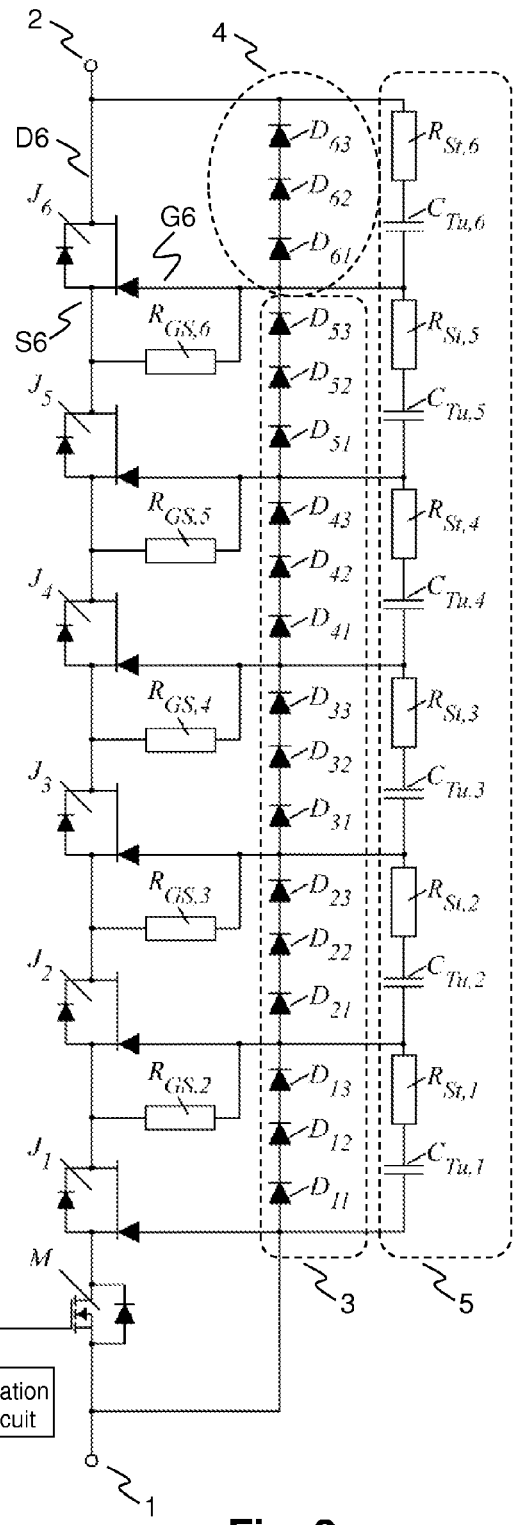
Fig. 1
Prior Art
Fig. 2

JFET SERIES CONNECTION

The invention relates to the field of electronic circuit technology and in particular to a switching device with a series connection of JFETs (junction field effect transistors), according to the preamble of patent claim 1

STATE OF THE ART

Power switches or switching devices for switching at high operating voltages may be realised in power-electronic switches by way of cascading or arranging transistors in series. Thereby, according to U.S. Pat. No. 6,822,842 or DE 199 26 109 A1, such switch devices are for example called a cascode circuit, which are based on the special circuiting-together of a MOSFET M and at least one JFET $J_1$, illustrated by FIG. 1. The switches are arranged between a first connection 1 and a second connection 2 and are controlled by a control connection 7 of the MOSFET M. This known switch device for high operating voltages based on cascode topology envisages the connection of several JFETs $J_2 \ldots J_i$ in series, and thus the attainment of a high blocking voltage. For the protection of the JFETS, diodes, i.e. protective diodes $D_1$-$D_5$ applied in blocking operation are connected to the gate connections of the JFETs. These protective diodes connect the gate connections of the JFETs amongst one another, or in each case lead from the gate connections to a common connection 1 at a base potential, to which the MOSFET is also connected. The manner of functioning of the protective diodes $D_1$-$D_5$ for the protection of the JEFTs is described in U.S. Pat. No. 6,822,842.

A non-uniform distribution of the blocking voltage across the JFETs may arise due to different or too large junction capacitances of the protective diodes $D_1$-$D_5$. Thereby, it is particularly with the uppermost JFET $J_6$ of FIG. 1 that a different capacitance acts in the gate connection than with the lower JFETs. This different loading of the gate connections may greatly influence the dynamic division of the blocking voltage and lead to the uppermost transistor firstly taking up the complete voltage between the connections and being destroyed in the worst case.

DESCRIPTION OF THE INVENTION

It is therefore the object of the invention to provide a switching device with a series connection of JFETs of the initially mentioned type, which overcomes the mentioned disadvantages.

This object is achieved by a switching device with a series connection of JFETs, with the features of patent claim 1.

The switching device for switching a current between a first connection and a second connection thus comprises a series circuit of at least two JFETs, of which a lowermost JFET is connected to the first connection or is connected to the first connection via a control switch arranged in series. At least one further JFET is present, which is connected in series to the lowermost JFET, wherein the JFET which is distanced furthest to the lowermost JFET is indicated as the uppermost JFET and with its drain connection is connected to the second connection. A stabilisation circuit for stabilising the gate voltages of the JFETS, is connected between the gate connections of the JFETs and the first connection. Thereby, an additional circuit is connected between the gate connection of the uppermost JFET and the second connection, and this additional circuit draws the potential at the gate connection of the uppermost JFET to the potential at the drain connection of the uppermost JFET and reduces the voltage.

By way of this, with the switched-on uppermost JFET, the voltage at the gate is kept slightly above, preferably however equal to the voltage at the source connection, by which means when switching-off, the uppermost JFET remains switched on for longer than without the additional circuit. By way of this, one again prevents the complete voltage between the first and the second connection lying across the uppermost JFET.

The network with the stabilisation circuit and the additional circuit has the effect that JFETs which are arranged further to the top, are switched off more slowly when switched off and are switched on more rapidly, preferably have synchronous switching-on points in time, than JFETs which are arranged further below.

By way of this, the dynamic blocking voltage distribution of the power switch which is constructed with transistors arranged in series, is balanced as well as stabilised due to the complete circuit network of the stabilisation circuit and additional circuit.

The stabilisation circuit seen per se, generally speaking and for each of the JFETs, is capable of leading away a given current between its gate connection and the first connection. The additional circuit together with the stabilisation circuit effects a symmetrical voltage loading of the gate connections of the JFETs connected in series.

The series connection of the JFETs may be realised with an activation of the lowermost JFET in a cascode circuit. Thereby, the series connection comprises a control switch, for example a MOSFET which is connected between the first connection and a lowermost JFET. Alternatively, the JFETs may also be activated differently, for example the lowermost JFET with a direct activation of its gate connection by way of a driver circuit.

The temporal behaviour of the passive activation of the uppermost JFET, if it is realised by one or more further diodes, may be set by way of the selection of the total junction capacitance of the series connection of these further diodes. The junction capacitance may be set by way of the selection of the series further diodes and/or by way of the design of the individual further diodes. The complete blocking voltage or breakdown voltage of one or more diodes between the drain and gate of the uppermost JFET is selected at least approximately equally as with the remaining JFETs.

In a further preferred embodiment of the invention, the junction capacitance of the further diodes is kept low and instead of this a capacitance between the second connection and the gate of the uppermost JFET (and also of the further JFETs) is set by way of separate elements such as capacitors. The rapid switching behaviour may be optimised by way of an additional symmetrising network which is formed in this manner. The symmetrising network thus comprises a RC-network which is arranged between the gates of the JFETs and the first connection. For example, the gates in each case of successive JFETS are connected to a further capacitance in each case by a series connection of a resistance to a further capacitance, and the gate of the uppermost JFET is connected to the second connection by way of a preferably equally structured additional RC-element.

In another preferred embodiment of the invention, the gates of the JFETs except for the lowermost JFET are connected to the first connection in each case by a series connection of a resistance with a capacitance, and additionally the gate of the uppermost JFET is connected to the second connection by way of an additional circuit, preferably an additional RC-element of a series connection of a resistance with a further capacitance.

In a further preferred embodiment of the invention, the gates of the JFETs apart from the lowermost JFET are connected to the first connection in each case by way of a series connection of a resistance with a capacitance, and additionally the gates of the JFET are connected by way of one or more diodes to the second connection. The gate of the uppermost JFET is additionally connected to the second connection by way of an additional circuit, preferably an additional RC-element of a series connection of a resistance with a further capacitance.

In further preferred embodiments of the invention, a resistance for damping is not present at each of the capacitances (or the further capacitance), but only at one or more, preferably at JFETs lying further above.

Basically, a parallel connection of resistances to capacitances is also possible in the symmetrising network, however, with this, static losses as a result of the occurring static voltage divider are caused in the topology.

The symmetrising network is preferably designed such that balancing processes occurring in the course of a switching procedure, in the symmetrising network, have the smallest time constant at the uppermost JFET and the largest time constant at the lowermost JFET. Accordingly, the capacitance of the additional RC-element (or of an additional C-element) is smaller than the capacitance of the lowermost RC-element (or C-element) which is connected at the gate of the lowermost JFET. Preferably, the capacitance of the RC-elements or C-elements which lie therebetween successively increases from the top to the bottom. The balancing processes at the gates of the JFETs have balanced time constants due to the cooperation of the symmetrising network with the stabilisation circuit.

The effect of this is that—in comparison to the circuit without the symmetrising network—when switching the transistors or JFETs off, with the JFETs lying further to the top, it takes longer for the respective gate connection to reach the potential of the pinch-off voltage with respect to the respective source connection. By way of this, the upper JFETs remain switched on longer than the lower JFETs and accordingly the upper JFETs are switched off more slowly. Vice versa, the upper JEFTs on switching on are switched-on more quickly than without the additional circuit and the symmetrising network. Ideally, one achieves a completely synchronous switching-on and switching-off of all JFETs.

The temporal trajectories of the processes at the individual switches are matched to one another due to the design of the symmetrising network, so that the switching arrangement as a whole has a behaviour which balanced in an as optimal as possible manner, thus a switching of the individual JFETs which is as simultaneous as possible.

In a further embodiment of the invention, the control switch, for example a MOSFET is operated in the linear region. A damping of oscillations which are produced by junction capacitances is achieved by way of this.

The stabilisation circuit thus together with the additional circuit and the symmetrising network forms a dynamic voltage divider between the voltage at the first and at the second connection, which when switching takes place smooths out the voltage loading of the JFETs. Differently to the known power switches or switch devices for switching higher operating voltages, the balancing of the dynamic blocking voltage loading of the transistors is significantly improved by way of adding the additional circuit, for example by way of additional diodes, and moreover may be optimised in a targeted manner by way of an RC-circuit in a preferred embodiment of the invention.

Further preferred embodiments are to be deduced from the dependent patent claims.

BRIEF DESCRIPTION OF THE DRAWINGS

The subject-matter of the invention is hereinafter explained in more detail by way of preferred embodiment examples which are represented in the accompanying drawings. In each case are schematically shown in:

FIG. 1 a series circuit of junction FETs according to the state of the art;

FIG. 2 a first embodiment of the invention;

The reference numerals used in the drawings and their significance are listed in a conclusive manner in the list of reference numerals. Basically, the same parts are provided with the same reference numerals in the figures.

WAYS OF CARRYING OUT THE INVENTION

Figure 3:
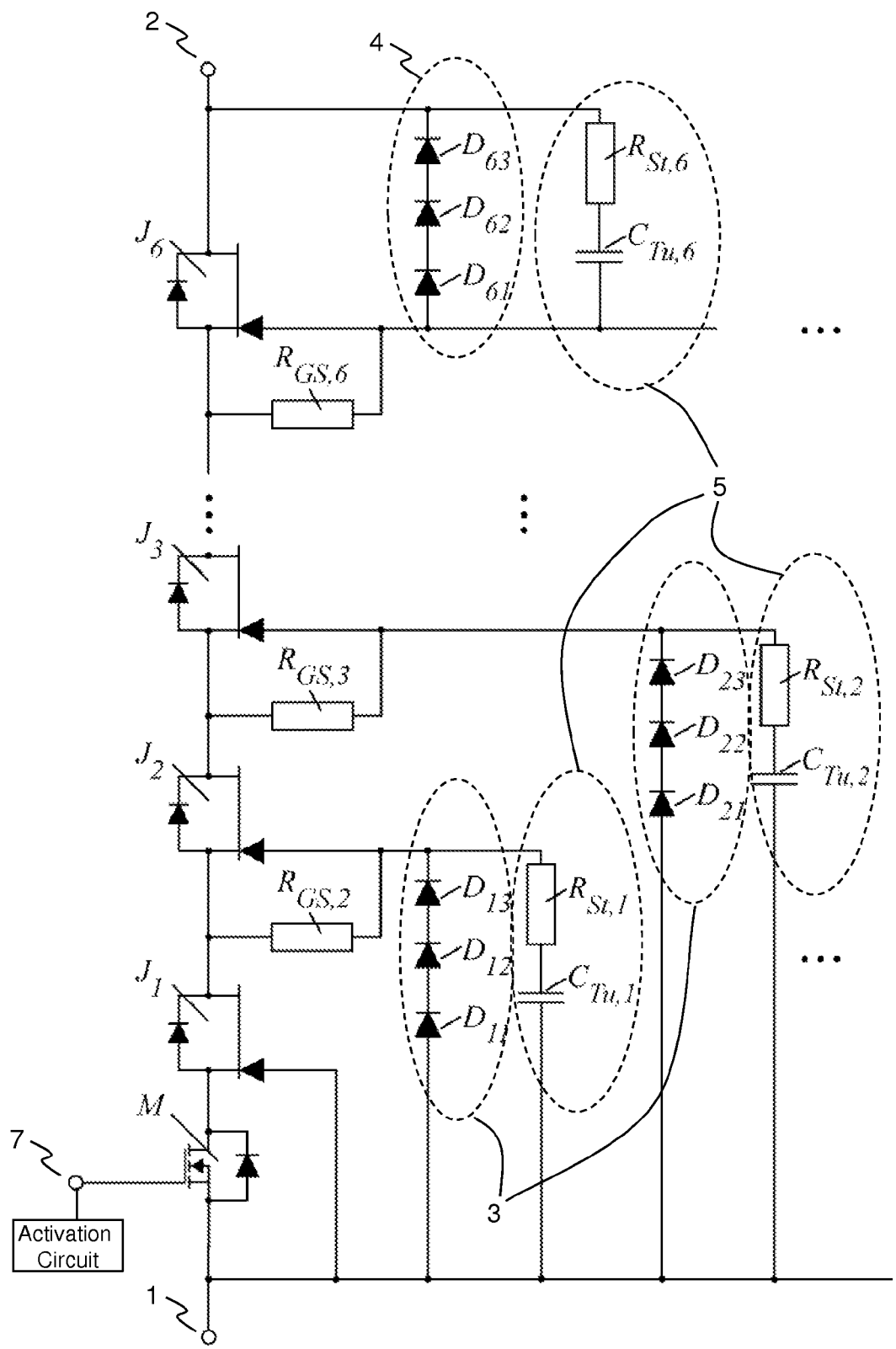
FIG. 3 a second embodiment of the invention.

The invention for a switch device of a high operating voltage is represented in FIG. 1. The switch comprises a cascode circuit of a MOSFET M with a first or lowermost JFET $J_1$ and at least one further JFET $J_2$-$J_6$ which is connected in series to this first JFET $J_1$. The lowermost or first JFET is therefore activated in the cascode circuit by a MOSFET acting as a control switch. The last JFET of the JFETs connected in series and which is distanced furthest from the first JFET is indicated as the uppermost JFET $J_6$. Merely by way of example, six JFETs are shown, but generally two or more JFETs may be present in other embodiments of the invention. A stabilisation circuit 3 is arranged for stabilising the gate voltages of the JFETs. This stabilisation circuit in each case between the gates of two consecutive JFETs comprises a series connection of protective diodes $D_{11}$-$D_{13}$, $D_{21}$-$D_{23}$, ... $D_{51}$-$D_{53}$ which are operated in the blocking direction. The number of protective diodes $D_{11}$-$D_{53}$ which each lie in series with one another, depends on the required blocking voltage of the protective diodes $D_{11}$-$D_{53}$. Generally, in each case, one or more protective diodes $D_{11}$-$D_{53}$ may be preset between the gates of two successive JFETs. Switch elements other than diodes are used in other embodiments of the invention.

In each case Zener diodes (in FIG. 1: $Z_{GS,2}$-$Z_{GS,6}$) or resistances (in FIG. 2: $Z_{Gs,2}$-$Z_{Gs,6}$) are connected between the gate and the source of the JFETs $J_2$-$J_6$, apart from the first JFET. These diodes or resistances stabilise the respective gate voltage in the stationary condition.

An additional circuit 4 is connected between the gate and the drain connection of the uppermost JFET for smoothing the voltage loading of the JFETs. This according to FIG. 2 comprises a series circuit of three further diodes $D_{61}$, $D_{62}$, $D_{63}$ which are operated in the blocking direction. The effect of these is that the potential at the gate connection of the uppermost JFET is drawn to the potential at the drain connection of the uppermost JFET and thus that potential prevailing between the drain connection and the gate connection is reduced. The further diodes $D_{61}$, $D_{62}$, $D_{63}$ ensure a symmetrical loading of the gate connections and stabilise the blocking voltage distribution. Additionally, they act as a protective element for the uppermost JFET $J_6$ against overvoltage between the drain and gate.

Instead of the further diodes, other switch elements may be present in the additional circuit, which create the same effect, e.g. only one or two or further diodes connected in series, a resistance, a capacitance or a RC-circuit.

In a preferred embodiment of the invention, a RC-element from a series connection of a resistance or damping resonance $R_{St,1}$-$R_{St,5}$ to a capacitance $C_{Tu,1}$-$C_{Tu,5}$ are connected in each case between the gates of two successive JFETs, parallel to the one or more protective diodes $D_{11}$-$D_{53}$ in each case. In this case, an analogous, preferably equally structured RC-element is connected parallel to the additional circuit 4, also between the gate and the drain connection of the uppermost JFET. Together, all these mentioned RC-elements form a symmetrising network 5.

The complete circuit network then therefore has additional to n diodes $D_{61}$, $D_{62}$, $D_{63}$ and the passive RC-network has damping resistances $R_{St,1}$ ... $R_{St,6}$ and capacitances $C_{Tu,1}$ ... $C_{Tu,6}$.

The total junction capacitance which is added in each case between the gate connections may be kept small by way of the series connection of the diodes. This, thanks to the additional capacitances $C_{Tu,1}$ ... $C_{Tu,6}$ permits the possibility of optimising the dynamic blocking voltage distribution or setting it independently of the junction capacitances. Thereby, the additional damping resistances $R_{St,1}$ ... $R_{St,6}$ are added, in order to damp oscillations caused by the additional capacitances $C_{Tu,1}$ ... $C_{Tu,6}$.

FIG. 3 shows an alternative, preferred embodiment of the invention, in which the gates of the JFETs $J_1$-$J_6$ are not connected amongst one another, but in each case separately with its own circuit of protective diodes $D_{11}$-$D_{53}$ and RC-element, to the first connection 1. As in FIG. 2, the gate connection $G_6$ of the uppermost JFET $J_6$ is connected via the additional network 4 to the second connection 2. The additional network 4 here may also comprise only one or more serially connected further diodes $D_{61}$-$D_{63}$, or other switch elements or the further diodes $D_{61}$-$D_{63}$ combined with a RC-series element $R_{St,6}$, $C_{Tu,6}$. The RC-elements $R_{St,1}$ ... $R_{St,6}$ and $C_{Tu,1}$ ... $C_{Tu,6}$ which per se are optional and are preferably applied for optimisation, here too together form the symmetrising network 5.

Figure 4:
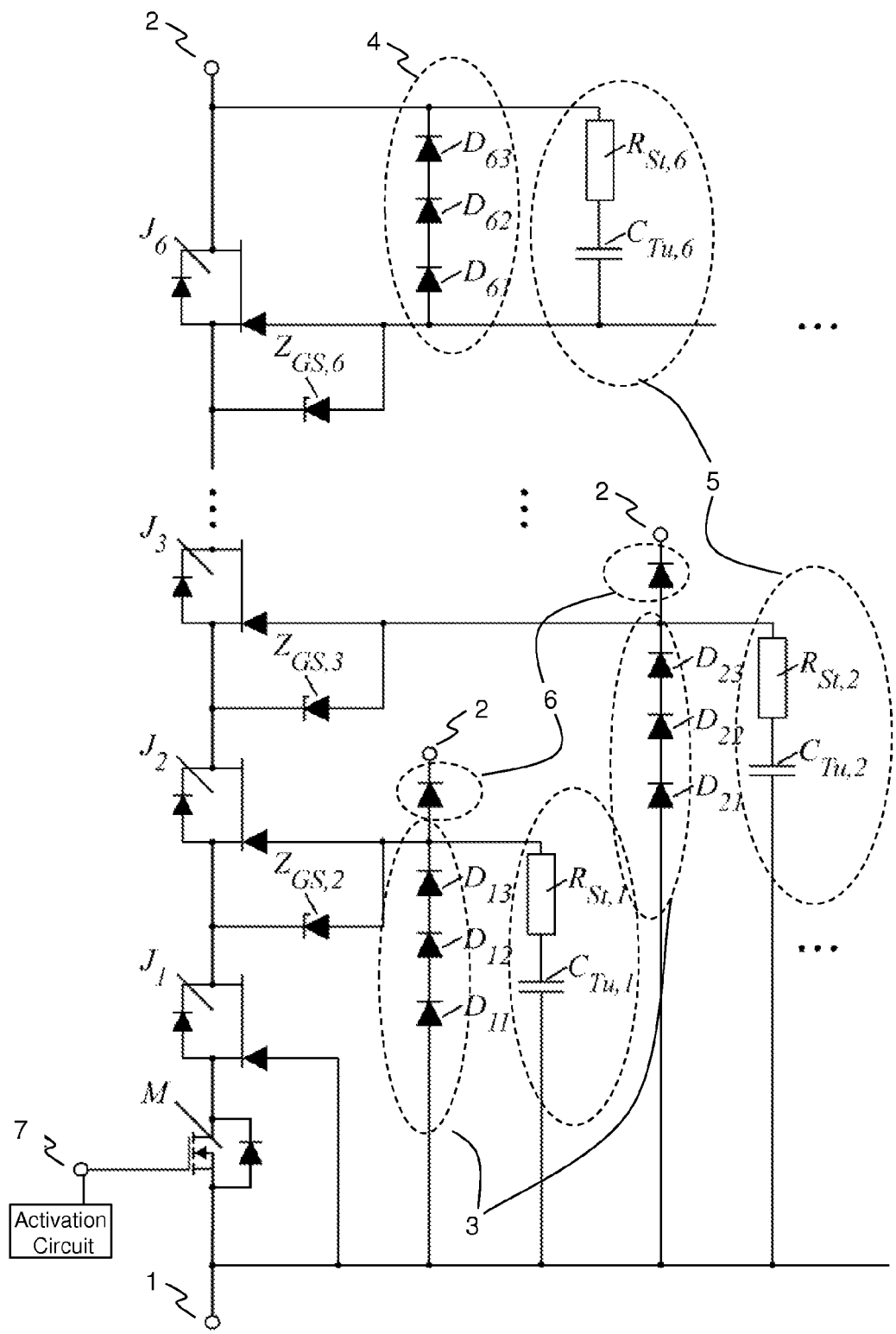
FIG. 4 a further embodiment of the invention.

FIG. 4 shows a further embodiment of the invention in which the gates of the JFETs $J_1$-$J_6$ are not connected amongst one another, but in each case separately with their own circuit of protective diodes $D_{11}$-$D_{23}$, of one or more additional diodes 6 which are connected by the respective gate connection to the second connection and are connected to the first connection 1 via an RC-element. The protective diodes $D_{11}$-$D_{23}$ and the additional diodes 6 in each cases form a voltage divider for the gate voltage which may be individually parameterised with respect to the voltage level and the dynamic behaviour (time constants). Instead of the individual diodes 6 which are shown in the figure, several diodes connected in series may be present. The additional network 4, as is arranged in FIG. 3, may also comprise one or more serially connected further diodes $D_{61}$-$F_{63}$, or other switch elements, or the further diodes $D_{61}$-$D_{63}$ combined with an RC-series element $R_{St,6}$, $C_{Tu,6}$. The RC-elements $R_{St,1}$ ... $R_{St,6}$ and $C_{Tu,1}$ ... $C_{Tu,6}$ which are optional per se and are applied preferably for optimisation here too together form the symmetrising network 5.

For all examples and for the invention as a whole, it is basically the case that the circuit, where appropriate may be analogously applied in a modified manner also for p-channel JFETs instead of the n-channel JFETs which are shown here.

The invention claimed is:

1. A switching device for switching a current between a first connection and a second connection, comprising:
   a series connection of at least two JFETs, of which a lowermost JFET is connected to the first connection or the lowermost JFET is connected in a cascode circuit via a control switch to the first connection;
   at least one further JFET which is connected in series to the lowermost JFET, wherein the JFET which is distanced furthest from the lowermost JFET is indicated as the uppermost JFET and with its drain connection is connected to the second connection;
   wherein a stabilisation circuit for stabilising the gate voltages of the JFETs is connected between the gate connection of the JFETs and the first connection;
   wherein an additional circuit is connected between the gate connection of the uppermost JFET and the second connection, and this additional circuit draws the potential at the gate connection of the uppermost JFET to the potential at the drain connection of the uppermost JFET; and
   wherein a symmetrising network comprising an RC-network arranged between the gates of the JFETs and the first connection is present.

2. The switching device according to claim 1, wherein the stabilisation circuit in each case leads away a settable current from the gate connections of the JFETs to the first connection, by way of protective diodes which are operated in the blocking direction and which in each case are arranged between the gate connections of successive JFETs or between the gate connections of the JFETs and the first connection.

3. The switching device according to claim 2, wherein the additional circuit together with the stabilisation circuit effects a symmetrical voltage loading of the gate connections of the JFETs.

4. The switching device according to claim 2, wherein the additional circuit comprises one or more further diodes which are operated in series and in the blocking direction between the gate connection of the uppermost JFET and the second connection.

5. The switching device according to claim 2, wherein the symmetrising network is designed such that balancing processes in the symmetrising network that occur when switching have the smallest time constant at the uppermost JFET and the largest time constant at the lowermost JFET.

6. The switching device according to claim 2, wherein the symmetrising network in each case between the gate connections of successive JFETs, apart from the lowermost JFET and the first connection, comprises a RC-element, and comprises an additional RC-element in parallel to the additional circuit.

7. The switching device according to claim 1, wherein the additional circuit together with the stabilisation circuit effects a symmetrical voltage loading of the gate connections of the JFETs.

8. The switching device according to claim 1, wherein the additional circuit comprises one or more further diodes which are operated in series and in the blocking direction between the gate connection of the uppermost JFET and the second connection.

9. The switching device according to claim 1, wherein the additional circuit is a passive network, said network being connected between the gate connection of the uppermost JFET and the second connection.

10. The switching device according to claim 1, wherein the stabilisation circuit in each case between the gate connections of successive JFETS comprises at least one diode with a first total blocking voltage, said diode being operated in the blocking direction, and the additional circuit comprises at least one further diode with a second total blocking voltage, said further diode being operated in the blocking direction, wherein the second total blocking voltage at least approximately is equal to the first total blocking voltage.

11. The switching device according to claim 1, wherein the symmetrising network is designed such that balancing processes in the symmetrising network that occur when switching have the smallest time constant at the uppermost JFET and the largest time constant at the lowermost JFET.

12. The switching device according to claim 11, wherein the symmetrising network in each case between the gate connections of successive JFETs comprises a capacitance and in parallel to the additional circuit comprises a further capacitance, and a damping resistance is connected in series to at least one of the capacitances or to the further capacitance.

13. The switching device according to claim 11, wherein the symmetrising network in each case between the gate connections of successive JFETs, apart from the lowermost JFET and the first connection, comprises a RC-element, and comprises an additional RC-element in parallel to the additional circuit.

14. The switching device according to claim 1, wherein the symmetrising network in each case between the gate connections of successive JFETs comprises a capacitance and in parallel to the additional circuit comprises a further capacitance, and a damping resistance is connected in series to at least one of the capacitances and to the further capacitance.

15. The switching device according to claim 1, wherein the symmetrising network in each case between the gate connections of successive JFETs, apart from the lowermost JFET and the first connection, comprises a RC-element, and comprises an additional RC-element in parallel to the additional circuit.

16. The switching device according to claim 15, wherein the circuit comprises an activation circuit for activating the control switch which operates the control switch in a linear range.

* * * * *